United States Patent [19]
Ohbuchi et al.

[11] Patent Number: 5,774,339
[45] Date of Patent: Jun. 30, 1998

[54] IC CARD AND METHOD OF MAKING THE SAME

[75] Inventors: Jun Ohbuchi; Hiroshi Miura; Kiyotaka Nishino; Shigeo Onoda; Tetsuro Washida; Makoto Omori, all of Tokyo, Japan

[73] Assignee: Mitsubishi Denki Kabushiki Kaisha, Tokyo, Japan

[21] Appl. No.: 759,002

[22] Filed: Dec. 2, 1996

[30] Foreign Application Priority Data

May 30, 1996 [JP] Japan .................................. 8-136599

[51] Int. Cl.[6] .................................................. H05K 1/14
[52] U.S. Cl. ...................... 361/737; 361/740; 361/747; 361/759; 235/380
[58] Field of Search ..................................... 361/736, 737, 361/740, 741, 742, 745, 747–749, 752–754, 756, 758–759, 770, 801–803, 820; 235/380, 492, 441, 435, 487; 264/272.11, 272.14, 274, 275; 29/846, 855–856

[56] References Cited

U.S. PATENT DOCUMENTS 5,067,008  11/1991  Yanaka et al. ............................ 357/81
5,339,222  8/1994  Simmons et al. ....................... 361/818
5,461,256  10/1995  Yamada et al. ......................... 257/679

FOREIGN PATENT DOCUMENTS 1241496   9/1989   Japan .
2139783  11/1990   Japan .
 352182   5/1991   Japan .

*Primary Examiner*—Leo P. Picard
*Assistant Examiner*—Phuong T. Vu

[57] ABSTRACT

An IC card includes a first cover including a first flat panel portion and a first upright wall portion formed therein adjacent a perimeter of the flat panel portion so as to extend transverse to the flat panel portion, and a second cover including a second flat panel portion and a second upright wall portion formed therein adjacent a perimeter of the flat panel portion so as to extend transverse to the flat panel portion. The first upright wall portion defines a chamber in cooperation with a portion of the first flat panel portion. The first and second covers are mated together with the first and second upright wall portions bonded together in a butt fashion.

6 Claims, 3 Drawing Sheets

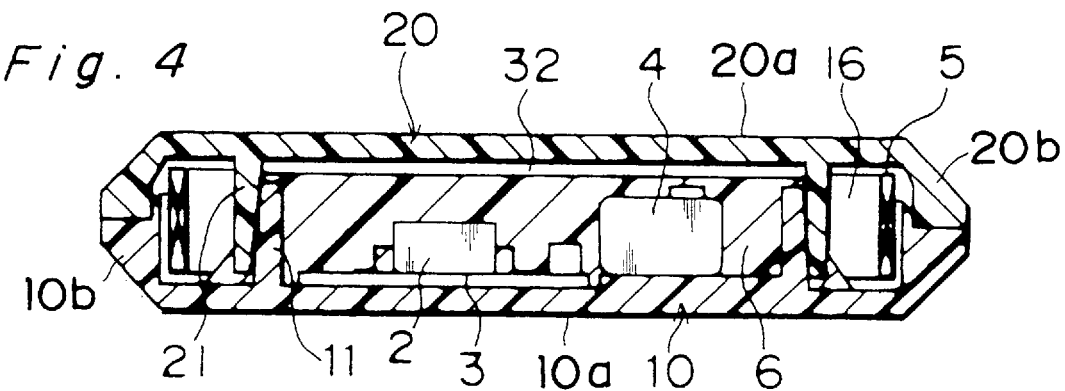
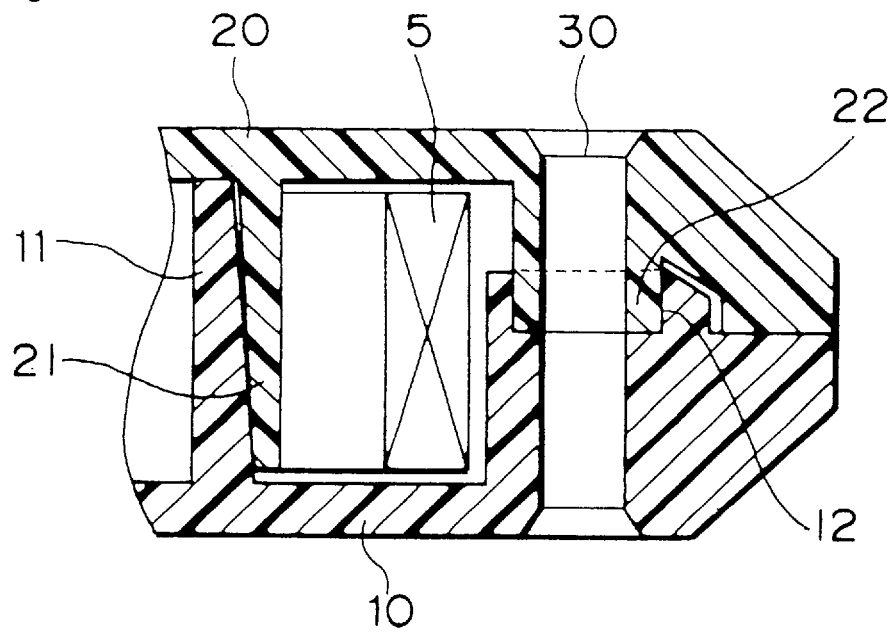
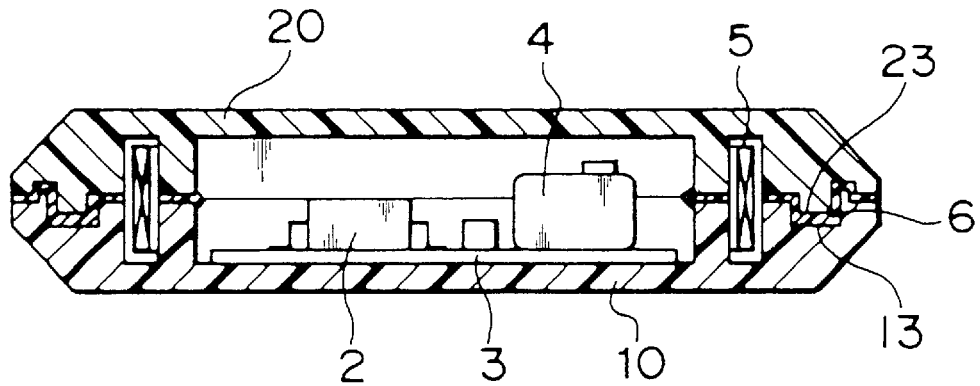

IC CARD AND METHOD OF MAKING THE SAME

BACKGROUND OF THE INVENTION

1. (Field of the Invention)

The present invention generally relates to an IC card and, more particularly, to the IC card of a non-contact type which has no interfacing terminal electrode exposed to the outside, but utilizes wireless signals such as electromagnetic waves for communication with external system appliances.

2. (Description of the Prior Art)

The non-contact type IC cards are not a recent development and are now coming into widespread use. One example of the prior art non-contact type IC card is schematically shown in FIG. 6 in sectional representation.

The prior art IC card shown in FIG. 6 is assembled by mounting a circuit module 3, including various electronic component parts 2 and a power source cell 4 incorporated therein, on a generally rectangular first cover 10 made of thermoplastic resin, then mounting of an antenna coil 5 for selective transmission and receiving data by means of wireless signals to and from an external system appliance, applying a thermosetting bond 6 of, for example, an epoxy resin to a flat mating face of a peripheral wall which is parallel to a plane of a panel body of the first cover 10 and which is partially formed with a peripheral recess 13, mounting a similarly shaped second cover 20, made of a similar thermoplastic resin, onto the first cover 10 with a peripheral protuberance 23 received within the peripheral recess 13, and finally heating the assembly to cure the thermosetting bond 6 to thereby complete the IC card.

The prior art IC card so assembled is susceptible to trouble. One of the troubles has been found resulting from separation between the first and second covers 10 and 20, that is, an insufficient adhesive between the first and second covers 10 and 20.

In order to achieve a sufficient robust bond between the first and second covers 10 and 20, a very popular attempt is to increase the mating bond areas of the first and second covers 10 and 20. It has, however, been found that since increase of the bond areas results in increase of the size of the IC card, increase of the bond areas is limited for the IC card which requires a compact size and a light-weight feature.

The inventors of the present invention have examined the bond strength between the first and second covers and, as a result thereof, have found that, for a given area of surface of contact between the first and second covers 10 and 20, the bond strength measured in a direction parallel to, that is, in a shearing direction of, the bond areas of the first and second covers 10 and 20 is ten or more times that measured in a direction perpendicular to any one of the bond areas of the first and second covers 10 and 20.

Also, in the manufacture of the prior art IC card, it has often been found that during the adhesive between the first and second covers, a deposit of the adhesive tends to run outwardly to eventually form bond flashes. Once the bond flashes are formed along a joint between the first and second covers, an extra process step of removing the bond flashes is required during the manufacture of the IC card.

SUMMARY OF THE INVENTION

The present invention is based on the above described finding and is intended to provide an improved non-contact IC card in which the first and second covers are sufficiently bonded together to exhibit an increased bond strength with no need to increase the mating bond areas of the first and second covers.

Another important object of the present invention is to provide an improved non-contact IC card of the type referred to above wherein no extra step of removing the bond flashes such as required in the prior art is required.

To accomplish these objects, the present invention provides an IC card which comprises a first cover including a first flat panel portion and a first upright wall portion formed therein adjacent a perimeter of the flat panel portion, and a second cover including a second flat panel portion and a second upright wall portion formed therein adjacent a perimeter of the flat panel portion. The first upright wall defines a chamber for storing IC parts in cooperation with a portion of the first flat panel. The first and second covers are mated together with the first and second upright walls having a joint face bonded together in a butt fashion such as a cap-and-cup fashion or an inclined butt fashion.

The cap-and-cup joint so formed utilizes a peripheral surface of the first upright wall to form a plane of joint with a mating peripheral surface of the second upright wall that lies at an angle relative to any one of the first and second flat panels. Similarly, the inclined butt joint so formed utilizes an inclined free end face of the first upright wall remote from the first flat panel to form a plane of joint with a corresponding inclined free end face of the second upright wall remote from the second flat panel that lies at an angle relative to any one of the first and second flat panels. In either case, the plane of joint angled relative to any one of the first and second flat panels allows a bond component acting in the shearing direction relative to the plane of joint to be used as a bond strength with which the first and second covers are bonded together. Accordingly, without the mating adhesive surface areas being increased, the bond strength of the IC card can be increased.

Preferably, each of the first and second covers may also includes a peripheral wall formed therein along the perimeter of the associated cover so as to extend generally transverse to the associated flat panel. By so doing, the respective peripheral walls of the first and second covers can, when the first and second covers are mated together, define a reservoir inside the IC card for accommodating a portion of the adhesive material squeezing from a plane of joint between the first and second upright walls. This is particularly advantageous in that since that portion of the adhesive material is accommodated within the reservoir invisible from the outside of the IC card, such a step of removing flashes of the adhesive material hitherto required in the prior art IC card can be dispensed with.

According to the present invention, the adhesive material filled in the chamber flows outwardly from the chamber over the first upright wall and is in turn supplied to the plane of joint between the first and second upright walls to thereby form a bond layer. Therefore, portion of the adhesive material squeezing from the surface areas to be bonded together can be accommodated within the reservoir without being flowing outwardly from the IC card and, therefore, no extra step of applying the adhesive is also needed, making it possible to simplify the process of making the IC card.

It may be possible that when an external stress may act on the IC card from the second cover, the circuit module accommodated within the IC card may be damaged. To avoid this possibility, the IC card may include an elastic cushioning element interposed between the adhesive layer, formed by curing the adhesive material filled in the chamber, and a portion of the second flat panel immediately above the adhesive layer so that the external stress applied to the IC card can be lessened to thereby protect the circuit module.

Instead of the use of the elastic cushioning element, a cushioning air layer may be employed. This air layer can readily be formed by designing the first upright wall to have a free end terminating at a position spaced a distance inwardly from the second flat panel to allow the cushioning air layer to be formed between the second flat panel and the bond layer in the chamber when the first and second covers are mated together.

The present invention also provides a method of making an IC card of the type comprising a first cover including a first flat panel and a first upright wall formed therein adjacent a perimeter of the flat panel so as to extend transverse to the flat panel and having a joint surface area, the first upright wall defining a chamber in cooperation with a portion of the first flat panel; and a second cover including a second flat panel and a second upright wall formed therein adjacent a perimeter of the flat panel so as to extend transverse to the flat panel and having a joint surface area. According to this method, a circuit module is first disposed within the chamber in the first cover, followed by filling an adhesive material within the chamber in a quantity sufficient to allow a top surface of the filled adhesive material to raise slightly above a plane flush with a free end face of the first upright wall. Then, the second cover is mounted on the first cover with the first upright wall encompassing the second upright wall, and the both are subsequently pressed together to allow a portion of the adhesive material within the chamber to squeeze outwardly from the chamber into a gap between the first and second upright walls so as to bond the first and second upright walls together.

With the IC card making method of the present invention, filling of the adhesive material within the chamber defined in the first cover and subsequent capping of the second cover over the first cover allows the adhesive material to be supplied to surface areas to be bonded together, no extra step of applying the adhesive material to the surface areas to be bonded together is needed, and therefore, no extra step of applying the adhesive material to the joint surface area is needed, making it possible to simplify the process of making the IC card.

Preferably, each of the first and second covers also includes a peripheral wall formed therein along the perimeter of the associated cover so as to extend generally transverse to the associated flat panel, such that the respective peripheral walls of the first and second covers, when the first and second covers are mated together, define a reservoir inside the IC card for accommodating portion of the adhesive material squeezing from a plane of joint between the first and second upright walls. In such case, when the first and second covers are mated together, that portion of the adhesive material can advantageously flow into the reservoir.

Because of this, no extra step of removing possible flashes is also needed, making it possible to simplify the process of making the IC card.

BRIEF DESCRIPTION OF THE DRAWINGS

These and other objects and features of the present invention will become clear from the following description taken in conjunction with a preferred embodiment thereof with reference to the accompanying drawings, in which like parts are designated by like reference numerals and in which:

FIGS. 2A to 2F illustrates the sequence of assemblage of the IC card embodying the present invention, wherein FIGS. 2C to 2D are taken along the line II—II in FIG. 1;

FIG. 4 is a view similar to FIG. 3, showing another modification of the IC card according to the present invention;

FIG. 5 is a fragmentary cross-sectional view taken along the line V—V in FIG. 1; and FIG. 6 is a view similar to FIG. 3, showing the prior art non-contact IC card.

DETAILED DESCRIPTION OF THE EMBODIMENT

Figure 1:
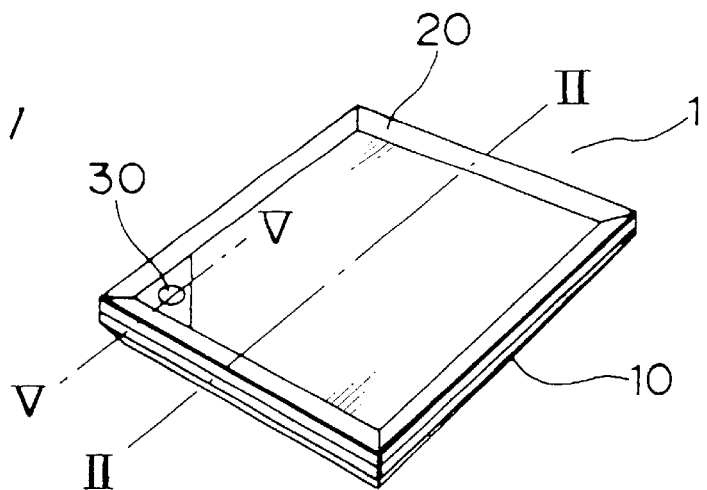
FIG. 1 is a schematic perspective view of a non-contact IC card embodying the present invention.
Figure 2A:
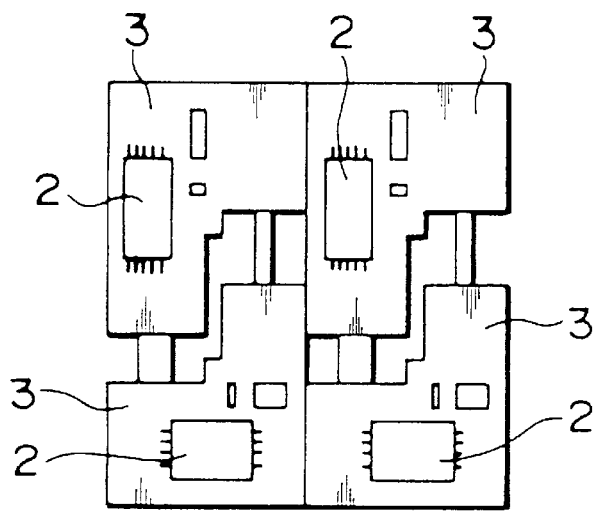
Figure 2B:
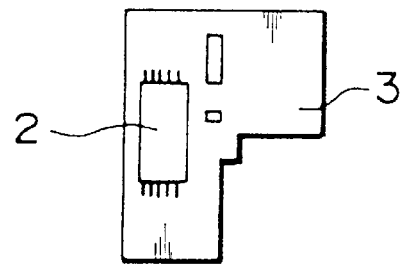
Figure 2C:
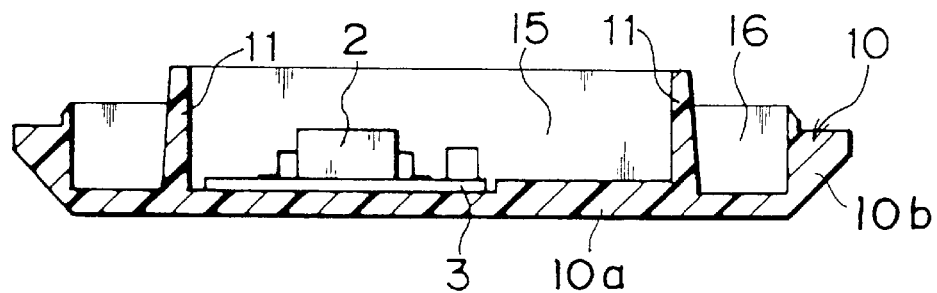
Figure 2D:
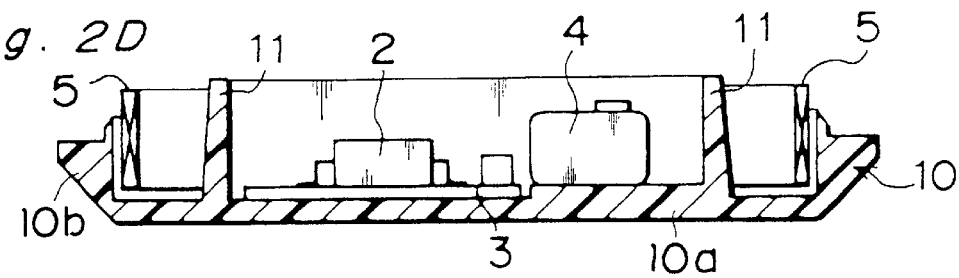
Figure 2E:
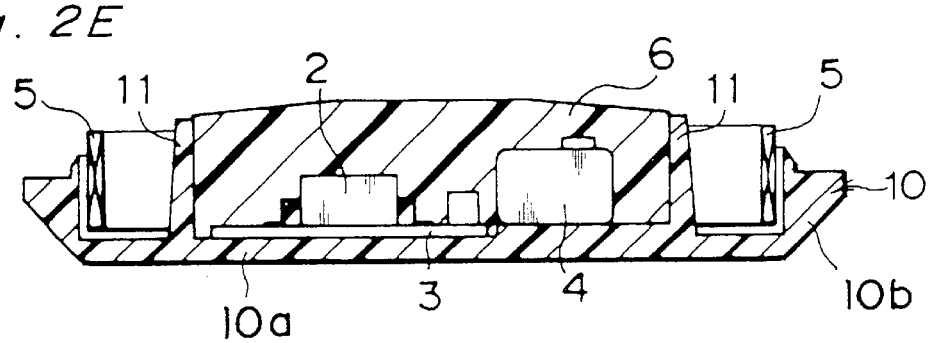
Figure 2F:
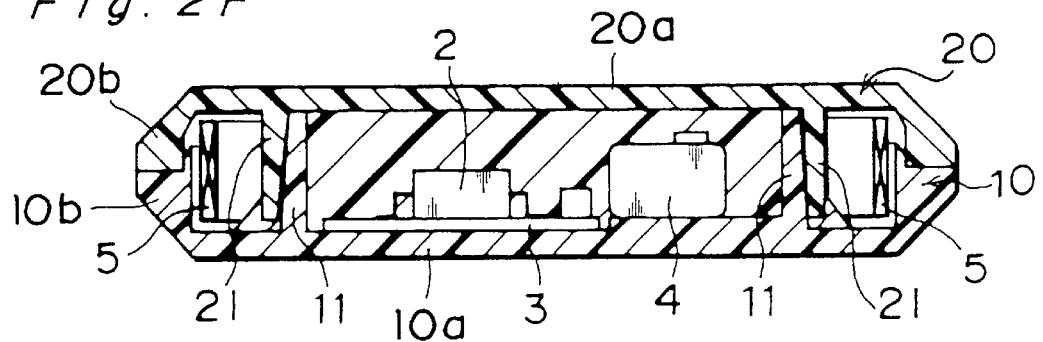

Referring first to FIGS. 1 and 2F, a non-contact IC card comprises, as is the case with the prior art IC card shown in and described with reference to FIG. 6, generally rectangular first and second covers 10 and 20 made of thermoplastic resin and having a substantially equal size. The first and second covers 10 and 20 are so configured and so designed that, when mated and boded together, they define a generally flattened closed box. Each of the first and second covers 10 and 20 comprises a flat panel 10a or 20a and a generally rectangular peripheral wall 10b or 20b formed integrally with the flat panel 10a or 20a so as to protrude from a perimeter of the flat panel 10a or 20b in a direction generally transverse thereto.

The flat panel 10a of the first cover 10 is formed integrally with a generally rectangular-sectioned tubular wall 11 which is positioned inside the peripheral wall 10b and which protrudes in a direction conforming to the direction of protrusion of the peripheral wall 10b, i.e., upwardly as viewed in FIG. 2F, and perpendicular to the flat panel 10a. Similarly, the flat panel 20a of the second cover 20 is formed integrally with a generally rectangular-sectioned tubular wall 21 which is positioned inside the peripheral wall 20b and which protrudes in a direction conforming to the direction of protrusion of the peripheral wall 20b, i.e., downwardly as viewed in FIG. 2F, and perpendicular to the flat panel 20a.

As will become clear from the subsequent description, one of the tubular walls 11 and 21 is so undersized relative to the other of the tubular walls 11 and 21 so that one tubular wall can be capped onto the other tubular wall so as to enclose the latter. In the illustrated embodiment, the tubular wall 11 is undersized relative to the tubular wall 21 and, accordingly, when the first and second covers 10 and 21 are mated together to complete the IC card, the tubular wall 21 receives therein and encompasses the tubular wall 11.

The IC card of the above described construction is assembled in the manner which will now be described with reference to FIGS. 2A to 2F. FIG. 2A illustrates a step of mounting electronic component parts 2 such as ICs (integrated circuits) and chip capacitors on a mother board to form a plurality of, for example, four, independent circuit modules 3 for the corresponding number of the IC cards.

The mother board shown in FIG. 2A is subsequently broken, or divided in any suitable manner, into the four circuit modules 3 as shown in FIG. 2B. The use of the mother board makes it possible to reduce the tact time required in accomplishing mounting of the IC components.

As shown in FIG. 2C, one of the four circuit modules 3 is then mounted in a chamber 15 defined in the first cover 10 by the tubular wall 11 in cooperation with the flat panel 10a. After the mounting of the circuit module 3, and as shown in FIG. 2D, a power source cell 4 is mounted inside the chamber 15 and soldered to associated terminals on the circuit module 3, followed by mounting and soldering of an antenna coil 5 for selective transmission and receiving of data to and from an external system appliance. The antenna coil 5 is, according to the present invention, accommodated within a peripheral space 16 defined between the tubular wall 11 and the peripheral wall 10b. As will become clear from the subsequent description, the peripheral space 16 concurrently serves as a sealed reservoir for a deposit of adhesive material.

Thereafter, as shown in FIG. 2E, a adhesive material 6 of thermosetting resin, for example, epoxy resin, is filled in the chamber 15 by the use of any suitable dispenser. The amount of the adhesive material 6 to be filled in the chamber 15 is preferably so chosen that, when the adhesive material 6 is completely filled in the chamber 15, the top surface of the filled adhesive material 6 can raise slightly above a plane flush with a free end face of the tubular wall 11 opposite to the flat panel 10b as clearly depicted in FIG. 2E, it being however to be noted that the amount of portion of the adhesive material that raises above the plane flush with the free end face of the tubular wall 11 should be smaller then the volume of the free space or reservoir 16.

Finally, as shown in FIG. 2F, the second cover 20 is mounted on the first cover 10 with the tubular wall 21 receiving therein the tubular wall 11 integral of the first cover 10. Thereafter, the assembly including the first and second covers 10 and 20 is placed in a constant temperature bath maintained at, for example, 70° C. to cause the adhesive material 6 to cure, thereby completing the IC card.

The tubular wall 11 of the first cover 10 is so sized relative to the tubular wall 21 of the second cover 20 that an annular gap of about 0.1 mm can be formed between an inner peripheral surface of the tubular wall 21 and an outer peripheral surface of the tubular wall 11. Accordingly, when the second cover 20 is mounted on the first cover 10 and is then pushed against the first cover 10 or the both are pressed together, that portion of the adhesive material 6 raising above the plane flash with the free end face of the tubular wall 11 is forced to flow into the annular gap between the mutually confronting outer and inner peripheral surfaces of the tubular walls 11 and 21 until it reaches a portion of the reservoir 16 adjacent a free end face of the tubular wall 21 positioned outside the tubular wall 11 of the first cover 10. Placement of the assembly within the constant temperature bath results in curing of not only a major portion of the adhesive material 6 filled within the chamber 15, but also that portion of the adhesive material 6 which has flowed into the annular gap between the mutually confronting outer and inner peripheral surfaces of the tubular walls 11 and 21.

Thus, according to the present invention, the adhesive material 6 used serves not only to bond the respective flat panels 10a and 20a of the first and second covers 10 and 20 together, but also to bond the mutually confronting outer and inner peripheral surfaces of the tubular walls 11 and 21 together. Since the mutually confronting outer and inner peripheral surfaces lie in a direction conforming to the direction along which the first and second covers 10 and 20 are separated and perpendicular to any one of the respective flat panels 10a and 20a, the IC card embodying the present invention can exhibit a bond strength which is ten or more times that exhibited by the IC card wherein surfaces to be joined together by the use of a adhesive material lie substantially parallel to any one of the flat panels, even though the area of each of the surfaces to be joined remains the same. Accordingly, with the IC card embodying the present invention, the possibility of separation of one of the covers from the other of the covers, which would result in a malfunctioning of the IC card, can advantageously be minimized.

Moreover, that portion of the adhesive material 6 which has reached and cured at the portion of the reservoir 16 adjacent the free end face of the tubular wall 21 is located inside the reservoir 16 and is invisible from the outside of the IC card. Thus, according to the present invention, no extra step of removing flashes of the adhesive material which are, according to the prior art IC card shown in FIG. 6, apt to be formed around the outer perimeter of the IC card, is needed during the manufacture of the IC card of the present invention. This makes it possible to simplify the manufacture of the IC card.

It is to be noted that respective free end faces of the peripheral walls 10b and 20b of the first and second covers 10 and 20, which are held in contact with each other when the second cover 20 is mounted onto the first cover 10 in the manner described above may or may not be bonded with each other, although in the illustrated embodiment they are not bonded together. Where the respective free end faces of the peripheral walls 10b and 20b are not bonded together such as shown, that portion of the adhesive material 6 which has flowed into the annular gap between the mutually confronting outer and inner peripheral surfaces of the tubular walls 11 and 21 is preferably accommodated within the reservoir 16 at a location adjacent the free end face of the tubular wall 21. For this reason, in consideration of the accuracy of filling of the adhesive material 6 into the chamber 15, the volume of a portion of the reservoir 16 below the level flush with the free end face of the peripheral wall 10b is preferably so chosen as to be about 30% of the volume of the chamber 15.

In the foregoing embodiment of the present invention, the adhesive material 6 has been shown and described as filled in the chamber 15. This is particularly advantageous in that both of the circuit module 3 and the electronic component parts 2 on the circuit module 3 can be firmly retained in position.

However, the present invention does not necessarily preclude the possibility of only the free end faces of the tubular walls 11 and 21 being bonded to the flat panels 20a and 10a, respectively.

In addition, in the illustrated embodiment, the tubular walls 11 and 12 have been shown and described as bonded in side-by-side fashion. In other words, each of the tubular walls 11 and 21 has such a length that when the first and second covers 10 and 20 are mated together the free end face of the tubular wall 11 and the free end face of the tubular wall 21 can terminate respectively within the second and first covers 20 and 10 to accomplish a so-called cap-and-cup joint. However, in the assembled condition of the IC card according to the present invention, the tubular walls 11 and 21 may be aligned in position with each other and, in such case, the extent to which each of the tubular walls 11 and 21 protrudes from the associated flat panel 10a or 20a towards the opposite flat panel 20a or 10a should be so chosen as to form an inclined butt joint. The inclined butt joint refers to a joint in which the plane of the joint between the tubular walls 11 and 21 in the assembled condition of the IC card extend slantwise relative to the direction of protrusion of the tubular walls 11 and 21 from the associated flat panel 10a and 20a.

Figure 3:
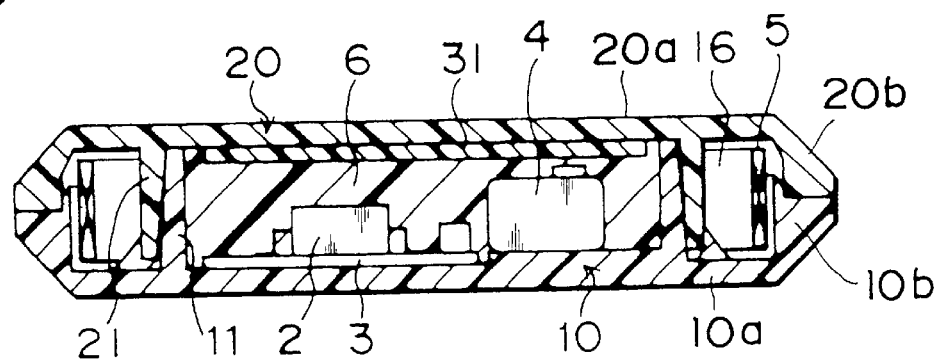
FIG. 3 is a schematic sectional view of a modified form of the IC card embodying the present invention.

Referring now to FIG. 3 showing a modified form of the IC card according to the present invention, a generally rectangular elastic sheet 31 such as, for example, a silicone rubber sheet, is interposed between the flat panel 20a of the second cover 20 and the cured adhesive material 6 within the chamber 15. The interposition of the elastic sheet 31 serves as a cushioning element effective to protect the circuit module 3 from being damaged by the effect of external impacts or shocks.

In another modified form of the IC card shown in FIG. 4, an air layer 32 is formed between the flat panel 20a of the second cover 20 and the cured adhesive material 6 within the chamber 15. This air layer 32 can readily be formed by choosing the extent of protrusion of the tubular wall 11 to such a value that, when the first and second covers 10 and 20 are mated together, the free end face of the tubular wall 11 may terminate at a position spaced a distance inwardly from the flat panel 20a of the second cover 20.

The air layer 32 shown in FIG. 4 serves the same purpose as that accomplished by the use of the elastic sheet 31 shown in FIG. 31.

FIG. 5 illustrates a cross-section, taken along the line V—V in FIG. 1, of one corner area of the IC card where a chain hole 30 is formed. This chain hole 30 is used for attachment of the IC card to a key holder by means of a connecting element such as, for example, a chain, thread or ring. As shown in FIG. 5, one corner area of the first cover 10 is formed with an annular recess 12 extending inwardly of the first cover 10 and, on the other hand, a corresponding corner area of the second cover 20 is formed with a annular projection 22 of a size sufficient to be press-fitted into the round recess 12. Thus, it will readily be understood that when the first and second covers 10 and 20 are mated together in the manner described hereinbefore, respective hollows in the annular recess and projection 12 and 22 are coaxially aligned with each other to define the chain hole 30.

The use of the annular projection 22 in the second cover 20 that is adapted to be press-fitted into the annular recess 12 in the first cover 10 is, regardless of the presence or absence of the chain hole 30, particularly advantageous in that any possible separation of the second cover 20 from the first cover 10 which would otherwise take place before the filled adhesive material 6 is completely cured can be eliminated.

From the foregoing description, it has now become clear that the first and second covers are mated together with the respective tubular walls bonded together in either a cap-and-cup fashion or an inclined butt fashion and, accordingly, a bond component acting in the shearing direction relative to the plane of joint enhances the bond strength of the plane of joint. Accordingly, as compared with the case in which the plane of joint does not incline such as in the prior art IC card, for a given adhesive area, the bond strength can be increased. In particular, if the plane of joint lies perpendicular to any one of the respective flat panels of the first and second covers, the bond strength can attain a value about ten times that exhibited by the prior art IC card, making it possible to minimize the possible occurrence of trouble in the IC card.

It is also clear that since according to the present invention filling of the adhesive material within the chamber defined in the first cover and subsequent capping of the second cover over the first cover allows the adhesive material to be supplied to surface areas to be bonded together, no extra step of applying a adhesive material to the surface areas to be bonded together is needed. Moreover, portion of the adhesive material squeezing from the surface areas to be bonded together can be accommodated within the reservoir without being flowing outwardly from the IC card and, therefore, no extra step of removing possible flashes is also needed, making it possible to simplify the process of making the IC card.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. An IC card which comprises:
   a first cover including a first flat panel portion and a first upright wall portion formed adjacent a perimeter of the flat panel portion, said first upright wall defining a chamber for storing IC parts in cooperation with said first panel portion;
   a second cover including a second flat panel portion and a second upright wall portion formed adjacent a perimeter of the flat panel; and
   said first and second covers being mated together with the first and second upright walls respectively having a first joint face and a second joint face thereof bonded together in a butt fashions,
   wherein each of the first and second covers further include respectively each peripheral upright walls formed therein along the outer perimeter of the associated cover so as to define a reservoir inside accommodating a portion of an adhesive material squeezing through a clearance between the first and second upright walls from the chamber for storing the IC parts when said first and second covers are mated together.

2. The IC card as claimed in claim 1, wherein a portion of the adhesive material to be filled in the chamber forms a contacting adhesive layer between the first and second upright walls for bonding the first and second covers.

3. The IC card as claimed in claim 2, further comprising a wide spread elastic cushioning element interposed between the adhesive layer filled in the chamber and an inner face of the second flat panel.

4. The IC card as claimed in claim 2, wherein the first upright wall has a free end terminating at a position spaced a distance inwardly from the inner face of the second flat panel to allow a cushioning air layer to be formed between the second flat panel and the adhesive layer in the chamber when the first and second covers are mated together.

5. The IC card of a non-contact type as claimed in claim 1, which has no interfacing terminal electrode exposed to the outside, but utilizes wireless signals for communication with external system appliances.

6. A method of making an IC card comprising a first cover including a first flat panel portion and a first upright wall portion formed therein adjacent a perimeter of the flat panel portion, said first upright wall portion defining a chamber in cooperation with a portion of the first flat panel portion; and a second cover including a second flat panel portion and a second upright wall portion formed therein adjacent a perimeter of the flat panel portion; each of said first and second upright wall portions respectively having a joint face; each of the first and second covers further including a peripheral wall formed therein along the outer perimeter of the associated cover so as to extend generally transverse to the associated flat panel, such that the respective peripheral walls of the first and second covers, when said first and second covers are mated together, define a reservoir inside the IC card accommodating portion of an adhesive material squeezing from a plane of Joint between the first and second upright walls, said method comprising the steps of:

disposing a circuit module within the chamber in the first cover;

filling an adhesive material within the chamber in a quantity sufficient to allow a top surface of the filled adhesive material to raise slightly above a plane flush with a free end face of the first upright wall portion;

mounting the second cover on the first cover with the first upright wall portion encompassing the second upright wall portion; and pressing the first and second covers together to allow a portion of the adhesive material within the chamber to squeeze outwardly from the chamber into a clearance between the first and second upright walls, thereby allowing that portion of the adhesive material to flow into the reservoir so as to joint the first and second upright walls together.

* * * * *